United States Patent [19]

Hirakawa

[11] Patent Number: 5,028,550
[45] Date of Patent: Jul. 2, 1991

[54] METHOD OF MANUFACTURING SEMICONDUCTOR DEVICE

[75] Inventor: Kenji Hirakawa, Yokohama, Japan

[73] Assignee: Kabushiki Kaisha Toshiba, Kawasaki, Japan

[21] Appl. No.: 543,378

[22] Filed: Jun. 26, 1990

[30] Foreign Application Priority Data

Jun. 27, 1989 [JP] Japan .................................. 1-164531

[51] Int. Cl.⁵ .......................................... H01L 21/88
[52] U.S. Cl. ..................................... 437/31; 437/162; 437/193; 437/194; 437/909; 148/DIG. 11; 148/DIG. 124
[58] Field of Search ...................... 437/31, 32, 33, 162, 437/189, 193, 194, 909; 148/DIG. 10, DIG. 11, DIG. 124

[56] References Cited

U.S. PATENT DOCUMENTS

| | | | |
|---|---|---|---|
| 4,125,426 | 11/1978 | Inayoshi et al. | 437/162 |
| 4,375,999 | 3/1983 | Nawata et al. | 437/162 |
| 4,465,528 | 8/1984 | Goto | 437/909 |
| 4,525,922 | 7/1985 | Kiriseko | 437/31 |
| 4,590,666 | 5/1986 | Goto | 437/33 |
| 4,978,630 | 12/1990 | Kim | 437/193 |

Primary Examiner—Brian E. Hearn
Assistant Examiner—Tuan Nguyen
Attorney, Agent, or Firm—Finnegan, Henderson, Farabow, Garrett and Dunner

[57] ABSTRACT

In a method of manufacturing a semiconductor device, when contact holes are to be formed in an insulating film formed on a monocrystalline or polycrystalline semiconductor layer, the contact holes can be formed using a polycrystalline semiconductor layer formed on the insulating film as a mask. Therefore, the lithographic step of forming the contact holes in the insulating film formed on the monocrystalline or polycrystalline semiconductor layer can be eliminated.

2 Claims, 9 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a semiconductor device for defining intervals between an opening edge of the emitter of a bipolar transistor and an opening edge of the base of the bipolar transistor and between the opening edge of the emitter of the bipolar transistor and an opening edge of the collector of the bipolar transistor.

2. Description of the Related Art

In recent years, in order to achieve high speed operation and high integration by decreasing a parasitic element such as a base resistor, a micropatterned active element, such as a self-aligned bipolar transistor has been manufactured.

In a method of manufacturing a self-aligned bipolar transistor, in order to form collector, emitter, and base electrodes, at least three lithographic steps, i.e., a patterning step for an emitter extracting electrode polysilicon layer, a contact hole forming step for an emitter extracting electrode polysilicon layer, and a patterning step for a metal layer, such as an aluminum layer for forming the collector, the emitter, and the base, are required.

A method of manufacturing a self-aligned bipolar transistor including at least these three lithographic steps will be described below with reference to the accompanying drawings.

FIGS. 1A to 1F are sectional views respectively showing semiconductor structures in manufacturing steps of a conventional method for a self-aligned bipolar transistor.

Figure 1A:
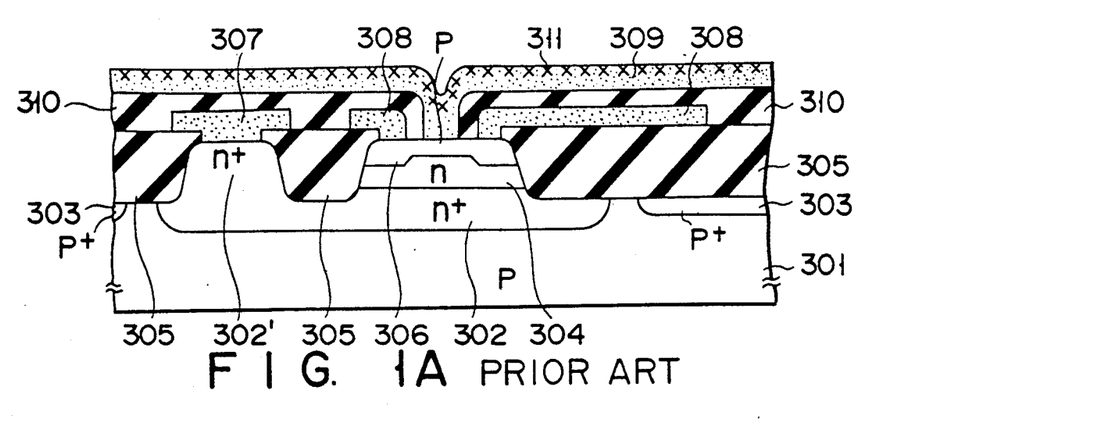
FIGS. 1A to 1F are sectional views showing semiconductor structures in manufacturing steps of a conventional method of manufacturing a semiconductor device.

FIG. 1A shows a sectional view of the semiconductor structure corresponding to a step in which an emitter extracting electrode polysilicon layer 309 has been formed by a normal method of manufacturing a selfaligned bipolar transistor.

As shown in FIG. 1A, a heavily doped n+-type buried layer 302 is selectively formed in a p-type silicon substrate 301. An n-type epitaxial layer 304, serving as a collector region, and a heavily doped n+-type diffusion region 302', serving as a collector extracting region, are formed in the heavily doped n+-type buried layer 302. A p-type base region 306 is formed in a surface layer of an n-type epitaxial layer 304, and a field oxide film 305 is selectively formed as a element isolating region. A heavily doped p+-type channel cut region 303 is formed below the field oxide film 305, serving as the element isolating region. A collector extracting electrode polysilicon layer 307 is formed on the heavily doped n+-type diffusion region 302'. A base extracting electrode polysilicon layer 308 and an emitter extracting electrode polysilicon layer 309 are formed on the p-type base region 306. The polysilicon layers 308 and 309 are electrically isolated from each other by the oxide film 310. In addition, an n-type emitter region forming impurity, such as arsenic (As) 311, is ion-implanted in the emitter extracting electrode polysilicon layer 309 at a dose of $1 \times 10^{16}$ cm$^{-2}$.

Figure 1B:
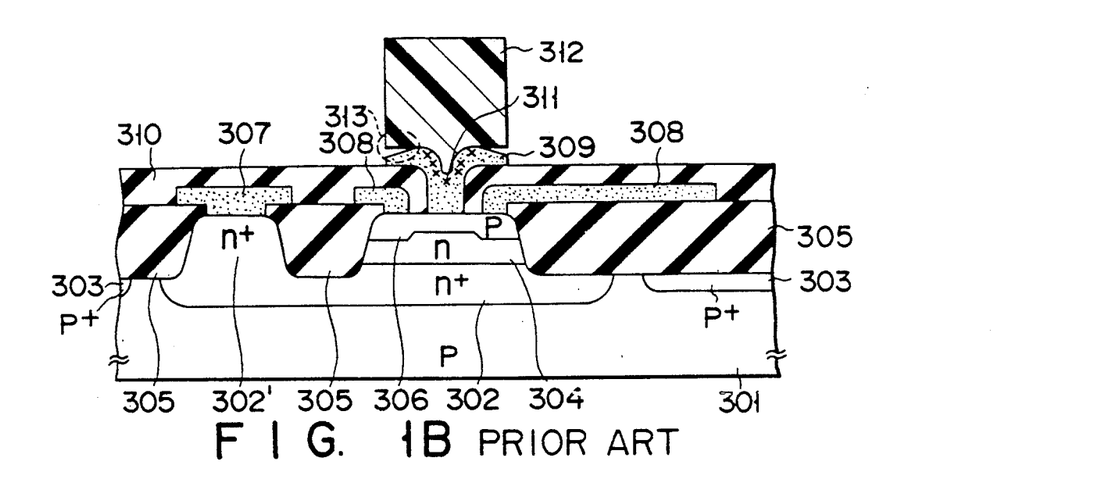

As shown in FIG. 1B, a photoresist layer 312 is formed on the entire surface of the resultant structure and developed into a predetermined shape by a photolithographic method, and the emitter extracting electrode polysilicon layer 309 is patterned into a predetermined shape using the photoresist layer 312 as a mask. The step which has been described above is the first lithographic step. In this case, when the emitter extracting electrode polysilicon layer 309 is patterned by a normal reactive ion etching method using, e.g., $CF_4 + O_2$ gas, the polysilicon layer 309 is side-etched to form side-etched portions 313. For this reason, the concentration of an impurity contained in the polysilicon layer 309 to form the emitter region is substantially decreased. The side-etched portion 313 having a depth of about 0.2 to 0.5 μm is formed on the upper surface region of the emitter extracting electrode polysilicon layer 309.

Figure 1C:
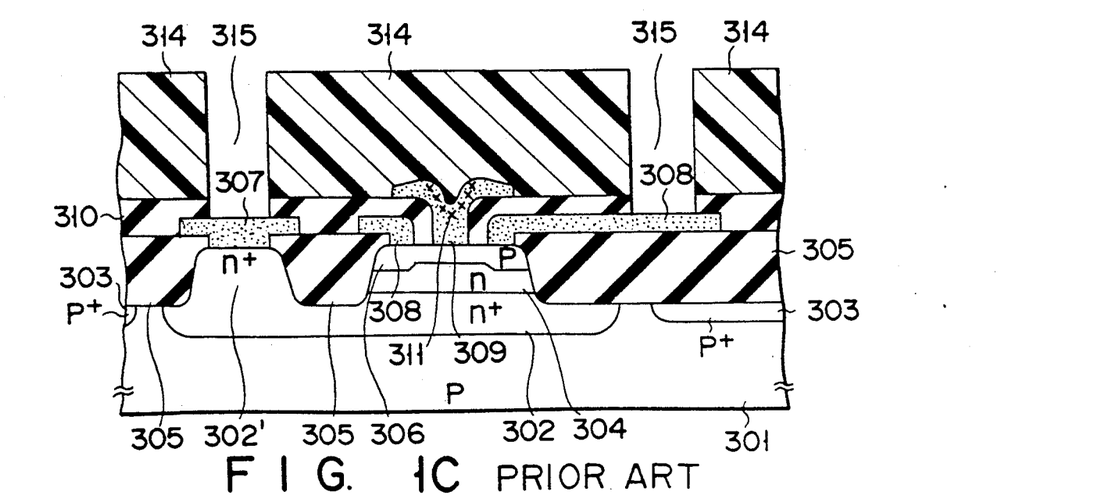

As shown in FIG. 1C, the photoresist layer 312 is removed, and a photoresist layer 314 is formed on the entire surface of the resultant structure again. The photoresist layer 314 is developed to have a predetermined shape, and contact holes 315, respectively reaching the collector extracting electrode polysilicon layer 307 and the base extracting electrode polysilicon layer 308, are formed in the oxide film 310 using the photoresist layer 314 as a mask. The step which has been described above is the second lithographic step.

Figure 1D:
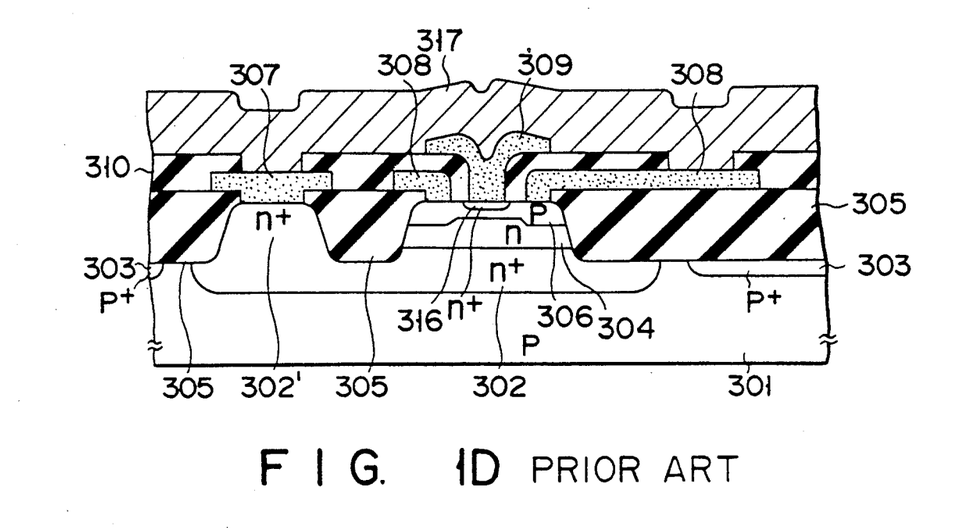

As shown in FIG. 1D, the photoresist layer 314 is removed, and the arsenic 311 serving as an emitter region forming impurity is thermally diffused in the emitter extracting electrode polysilicon layer 309 to form a heavily doped n+-type emitter region 316 in the p-type base region 306. An aluminum layer 317 is formed on the entire surface of the resultant structure by, e.g., a sputtering method.

Figure 1E:
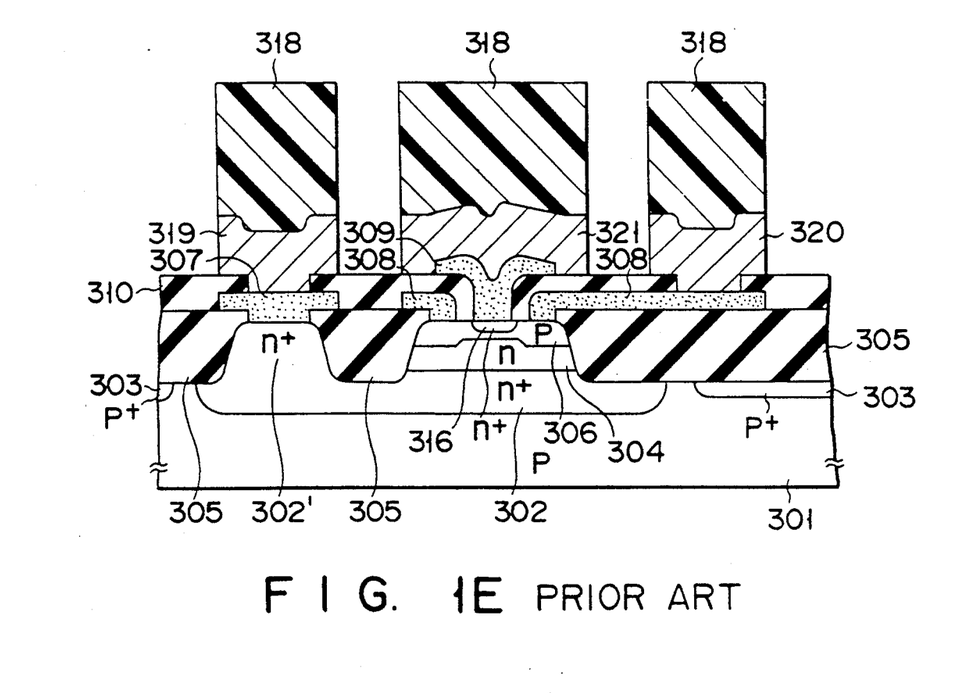

In FIG. 1E, a photoresist layer 318 is applied to the entire surface of the resultant structure, and the photoresist layer 318 is developed by a photographic method to have a predetermined shape. The aluminum layer 318 is patterned using the photoresist layer 317 as a mask to form collector, base, and emitter electrodes 319, 320, and 321. The step which has been described above is the third lithographic step.

Figure 1F:
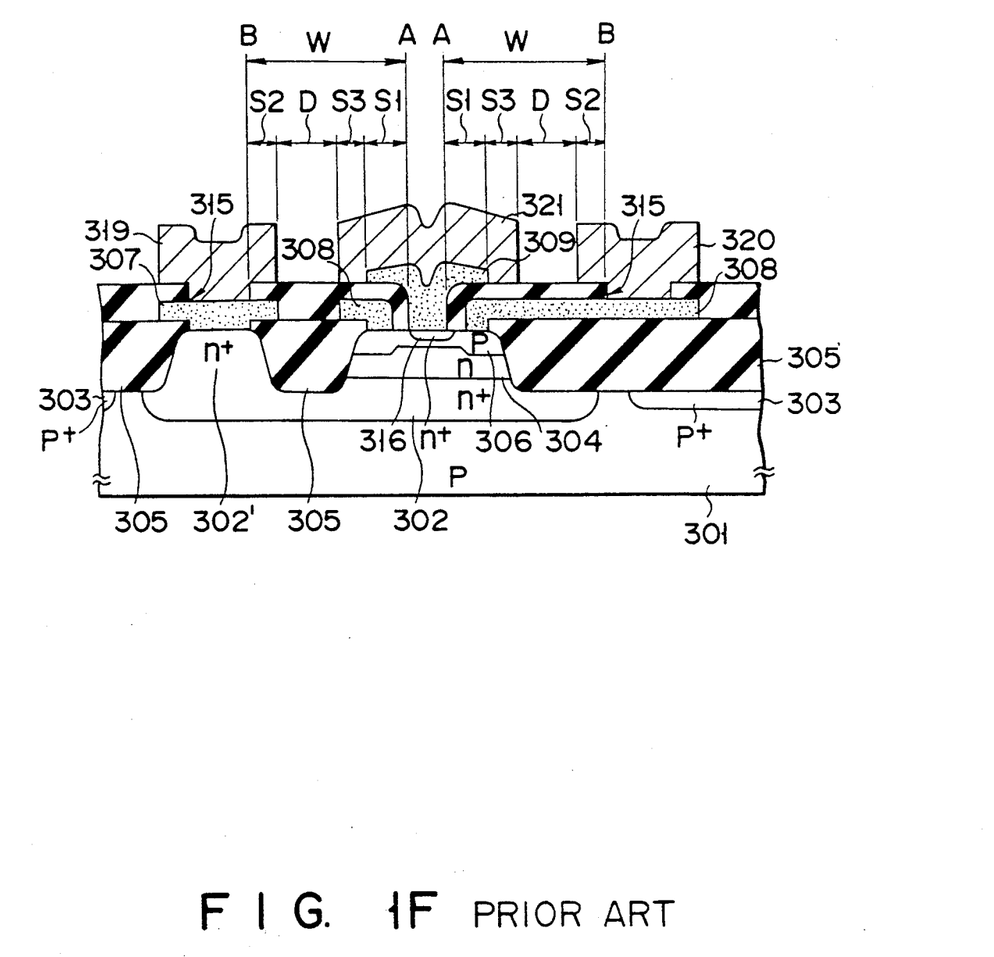

As shown in FIG. 1F, the photoresist layer 318 is removed, and a self-aligned bipolar transistor is formed by a conventional manufacturing method.

As has been described above, a method of manufacturing a conventional self-aligned bipolar transistor includes the above three lithographic steps.

Referring to FIG. 1F, intervals between an emitter opening edge and an opening edge of a base electrode contact portion and between the emitter opening edge and an opening edge of a collector electrode contact portion will be described below according to a conventional method of manufacturing a self-aligned bipolar transistor having at least three lithographic steps.

As shown in FIG. 1F, in the first lithographic step, a space S1 serving as an alignment margin between an emitter opening edge and the emitter extracting electrode polysilicon layer 309 is required as a countermeasure against mask misalignment. The alignment margin S1 is set larger than a normal alignment margin by 0.5 μm or more so as not to decrease an effective concentration of the impurity ion implanted in the emitter extracting electrode polysilicon layer 309 to form an emitter region.

In order to solve the above problem in which the emitter extracting electrode polysilicon layer 309 must be formed to be larger than the normal alignment margin by 0.5 μm or more, the following methods are available. The emitter extracting electrode polysilicon layer 309 may be annealed prior to patterning to sufficiently activate the impurity for forming the emitter region in the polysilicon layer 309, or the impurity for forming the emitter region may be contained by, e.g., a CVD (chemical vapor deposition) method during formation of the polysilicon layer 309. In such a method, however, the emitter region cannot be micropatterned. In the above second lithographic step, when an alignment margin between the collector extracting electrode polysilicon layer 307 and the contact hole 315, and an alignment margin between the base extracting electrode polysilicon layer 308 and the contact hole 315, are taken into consideration, these alignment margins are estimated to be included beforehand in the width of the collector extracting electrode polysilicon layer 307 and the width of the base extracting electrode polysilicon layer 308, respectively. For this reason, these margins will not be taken into further consideration. In the above third lithographic step, an alignment margin S2 between an opening edge of a collector electrode contact portion and the collector electrode 319, an alignment margin between an opening edge B of a base electrode contact portion and the base electrode 320, and an alignment margin between the emitter extracting electrode 309 and the emitter electrode 321 must be assured. Assuming that intervals between the emitter electrode 321 and the base electrode and between the emitter electrode 321 and the collector electrode 319 are commonly represented by D, an interval W between an emitter opening edge A and an opening edge B of a base electrode contact portion and an alignment margin between the emitter opening edge and an opening end B of a base contact portion are calculated by the following equation:

$$W = S1 + S2 + S3 + D$$

Therefore, in this step, an element cannot be micropatterned to have a width smaller than the width W. Furthermore, the alignment margin S1 must be larger than a normal alignment margin by 0.5 μm or more.

For the sake of the above limitation, in a conventional method of a self-aligned bipolar transistor, even if precision of lithography is improved, the intervals W between the emitter opening edge A and the opening edge B of the collector electrode contact portion and between the emitter opening edge A and the opening edge B of the base electrode contact portion are calculated by the following equation:

$$W = S1 + S2 + S3 + D$$

Therefore, the minimum intervals W are required. In addition, in order to set the impurity concentration of the emitter region 316 to a desired concentration, the alignment margin S1 must be larger than a normal alignment margin by 0.5 μm or more, and the is disadvantageous in micropatterning of an element. In addition, micropatterning of an element, i.e., a decrease in area due to micropatterning of various extracting electrode polysilicon layers is required for not only improving a degree of integration of elements but reducing a parasitic element such as a base resistor due to shortening of the base extracting electrode polysilicon layer 308.

SUMMARY OF THE INVENTION

The present invention has been made in consideration of the above problem, and has as its object to provide a method of manufacturing a semiconductor device wherein, in a step of forming an electrode and a metal wiring layer of a semiconductor device, electrodes and wiring layers of elements can be formed in a small area even with the order of the most advanced lithography by decreasing the number of lithographic steps, thereby micropatterning the elements and improving a degree of integration, and yield can be improved by reducing the number of steps, thereby reducing production cost.

According to the first aspect of the present invention, there is provided a method of manufacturing a semiconductor device in which an insulating film is present on a semiconductor layer, comprising the steps of: forming an insulating film on a semiconductor layer to have openings in a predetermined region of the semiconductor layer; forming a polycrystalline semiconductor layer for extracting a first electrode in the predetermined region of the semiconductor layer on the insulating film; selectively etching the polycrystalline semiconductor layer to form a contact hole for a second electrode; selectively removing the insulating film using as a mask the polycrystalline semiconductor layer which is selectively etched; forming a conductive layer on an entire surface of a resultant structure; and selectively etching the conductive layer and the polycrystalline semiconductor layer to form wiring layers for the first and second electrodes.

According to the second aspect of the present invention, there is provided a method of manufacturing a bipolar transistor including at least a collector region of a first conductivity type on a semiconductor substrate, a base region of a second conductivity type formed in the collector region of the first conductivity type, and an insulating film having at least one opening in the base region, comprising the steps of: forming an insulating film on a base region to have an opening in a prospective base forming region of a semiconductor substrate; forming a polycrystalline semiconductor layer entirely doped with an impurity of the first conductivity type; selectively etching a prospective base electorde forming region and a prospective collector electorde forming region of the polycrystalline semiconductor layer; diffusing an impurity of the first conductivity type in a base region through the opening of the insulating film in the base region to form an emitter region of the first conductivity type; and selectively removing the insulating film using the polycrystalline semiconductor layer as a mask to form base and collector electrode contact holes; forming a conductive layer on an entire surface of a resultant structure; selectively etching the conductive layer and the polycrystalline semiconductor layer.

In the method of manufacturing a semiconductor device as described above, when contact holes are to be formed in the insulating film formed on a monocrystalline or polycrystalline semiconductor layer, the contact holes can be formed using a polycrystalline semiconductor layer formed on the insulating film as a mask. Therefore, the lithographic step of forming the contact holes in the insulating film formed on the monocrystalline or polycrystalline semiconductor layer can be eliminated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A method of manufacturing a semiconductor device according to the present invention will be described below with reference to the accompanying drawings.

FIGS. 2A to 2G are sectional views showing semiconductor structures in manufacturing steps of a method of manufacturing a semiconductor device according to the present invention.

Figure 2A:
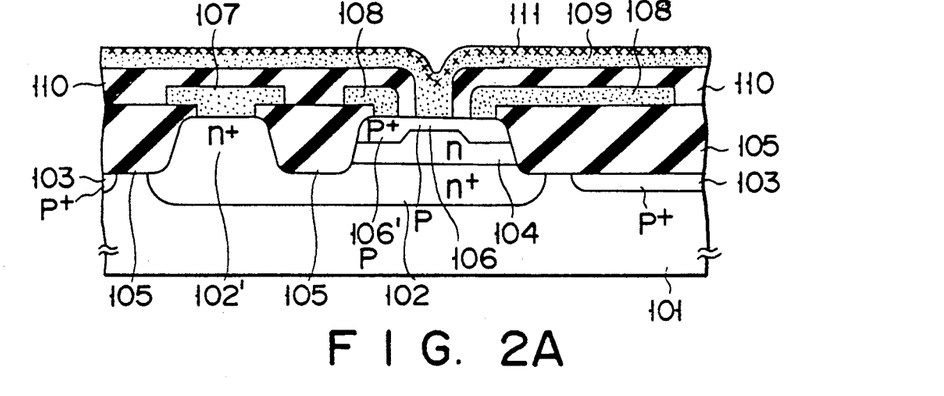
FIGS. 2A to 2G are sectional views showing semiconductor structures in manufacturing steps of a method of manufacturing a semiconductor device according to the first embodiment of the present invention.

FIG. 2A shows a section of the semiconductor structure corresponding to a step in which an emitter extracting electrode polysilicon layer 109 is formed by a normal method of manufacturing a self-aligned bipolar transistor.

As shown in FIG. 2A, a heavily doped $n^+$-type buried layer 102 is formed on, e.g., a p-type silicon substrate 101. An n-type epitaxial layer 104 prospectively serving as a collector region and a heavily doped $n^+$-type diffusion region 102', having a concentration higher than that of the n-type epitaxial layer 104, and prospectively serving as a collector extracting region, are formed on the heavily doped $n+$-type buried layer 102. A p-type intrinsic base region 106 and a heavily doped $p^+$-type outer base region 106', are formed in the surface region of the n-type epitaxial layer 104. A field oxide film 105 is selectively formed as an element isolating region. A heavily doped $p^+$-type channel cut region 103 is formed below the field oxide film 105 serving as the element isolating region. A collector extracting electrode polysilicon layer 107 is formed on the heavily doped $n^+$-type diffusion region 102' prospectively serving as the collector extracting region. In addition, a base extracting electrode polysilicon layer 108 and an emitter extracting electrode polysilicon layer 109 are respectively formed on the outer base region 106' and the intrinsic base region 106. The polysilicon layers 108 and 109 are electrically isolated from each other by an oxide film 110. For example, arsenic (As) ions 111 serving as an impurity for forming an n-type emitter region are implanted in the emitter extracting electrode polysilicon layer 109 at a dose of $1 \times 10^{16}$ cm$^{-2}$. In place of the ion implantation, an impurity may be contained in the polysilicon layer 109 by, e.g., a CVD method during formation of the polysilicon layer 109. However, in order to highly precisely control an impurity distribution of the emitter region, ion implantation is better than CVD.

Figure 2B:
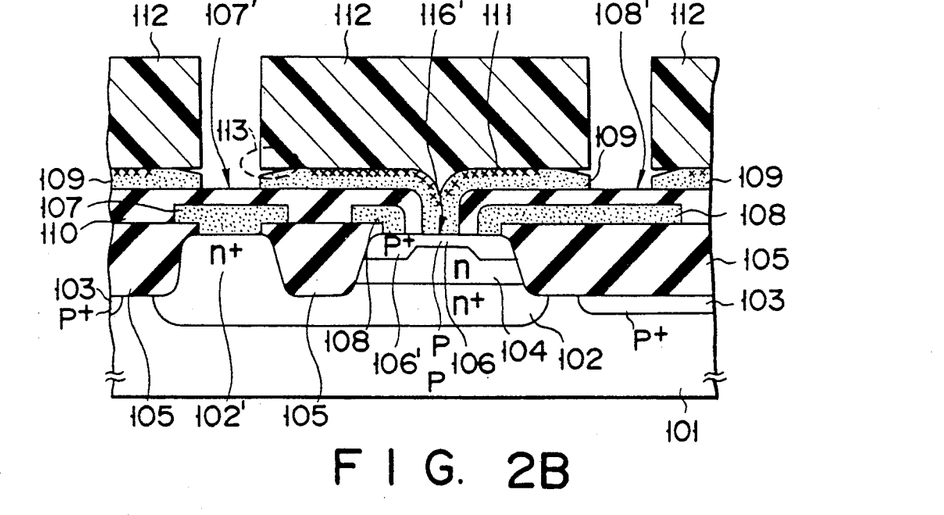

As shown in FIG. 2B, a photoresist layer 112 is formed on the entire surface of the resultant structure and developed to have a predetermined shape by a photolithographic method, and the emitter extracting electrode polysilicon layer 109 is patterned to have a predetermined shape using the photoresist layer 112 as a mask. In this patterning process, an opening toward a region 107' for prospectively forming a contact hole reaching the collector extracting electrode polysilicon layer 107, and an opening toward region 108' for prospectively forming a contact hole reaching the base extracting electrode polysilicon layer 108 are formed in the polysilicon layer 109. The above step is a first lithographic step. In this case, as in the prior art, when the emitter extracting electrode polysilicon layer 109 is patterned by a normal reactive ion etching method using, e.g., $CF_4 + O_2$ gas, the polysilicon layer 109 is side-etched to form a side-etched portion 113. According to the first embodiment, however, since the polysilicon layer 109 is left in wide regions between the prospective emitter forming region 116' and the prospective collector contact hole forming region 107' and between the prospective emitter forming region 116' and the prospective base contact hole forming region 108', an effective concentration of the impurity which forms an emitter region and is contained in the polysilicon layer 109 is not decreased.

Figure 2C:
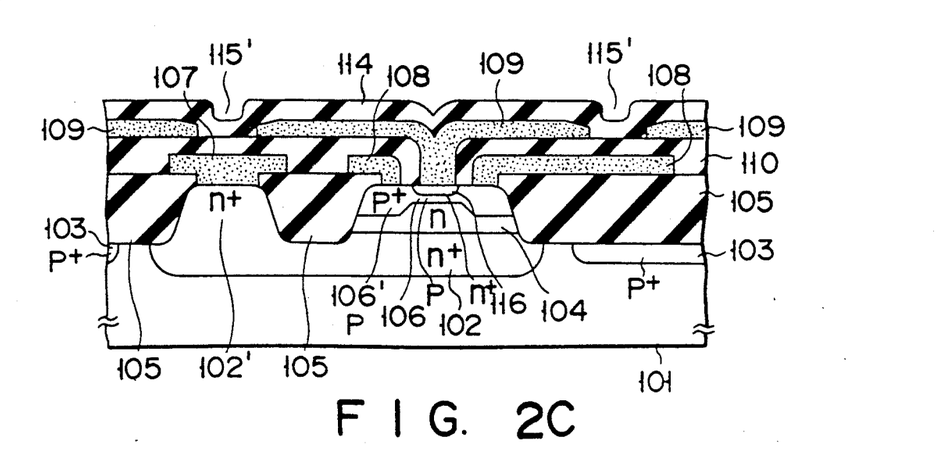

As shown in FIG. 2C, the photoresist layer 112 is removed, and a silicon oxide film 114 is formed on the entire surface of the resultant structure by, e.g., a CVD method. Thereafter, the arsenic ions 111 serving as an n-type impurity for forming the emitter in an emitter extracting electrode polysilicon layer 109 is thermally diffused by annealing to form a heavily doped $n^+$ type emitter region 116 in the base region. At this time, a transistor comprising a 100-μm thick collector contact portion 115', a 100-μm thick base contact portion 115', and a 100-μm thick emitter extracting electrode polysilicon layer 109 is provided in advance, and the oxide films 110 and 114 on the contact portions are etched. Thereafter, transistor characteristics of the transistor shown in FIG. 2C can be easily monitored by bringing a monitor probe into contact with the polysilicon layers 107 and 108. Therefore, the diffusion amount can be effectively controlled.

Figure 2D:
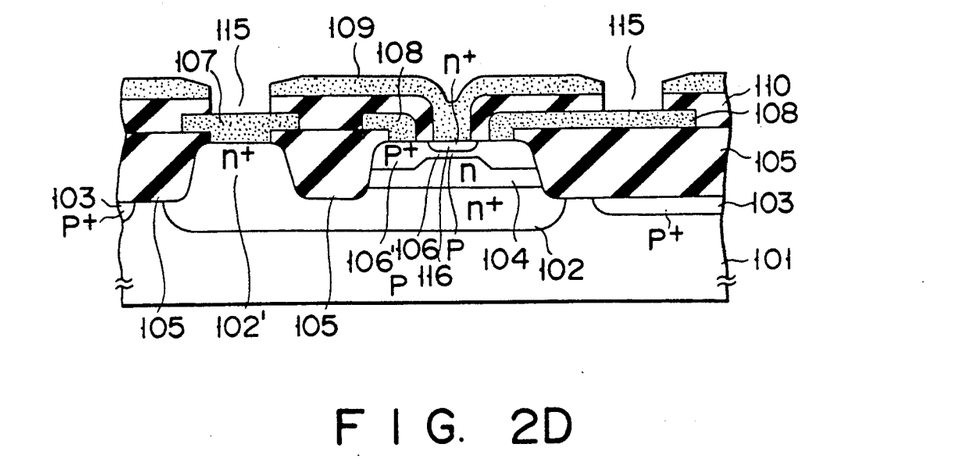

As shown in FIG. 2D, the oxide film 114 is removed by a reactive ion etching method using, e.g., $CF_4$ and $H_2$ gases, and etching is continued to form contact holes 115, respectively reaching the collector and base extracting electrode polysilicon layers 107 and 108 in the oxide film 110 using the emitter extracting electrode polysilicon layer 109 patterned into a predetermined shape as a mask.

Figure 2E:
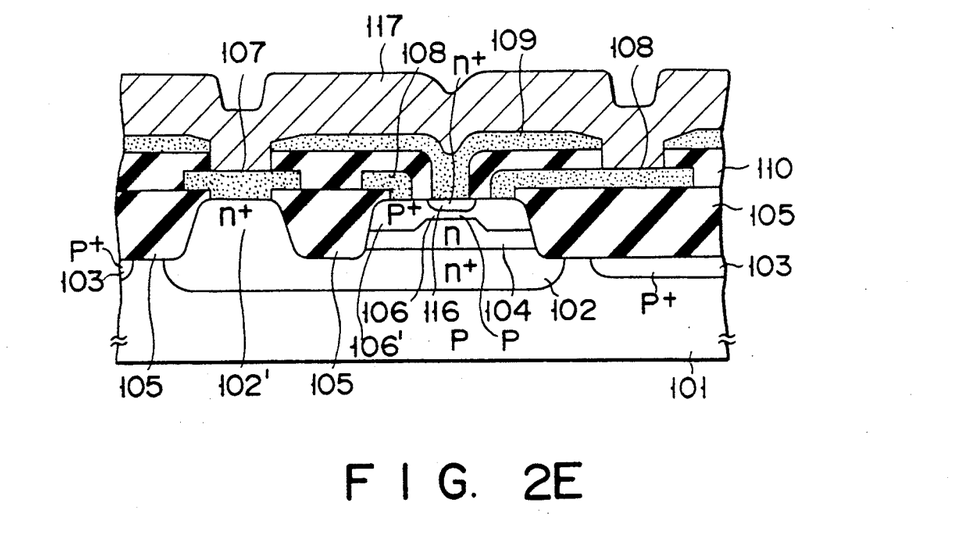

As shown in FIG. 2E, an aluminum layer 117 is formed on the entire surface of the resultant structure by, e.g., a sputtering method. In this case, any electrode material can be selected in place of aluminum.

Figure 2F:
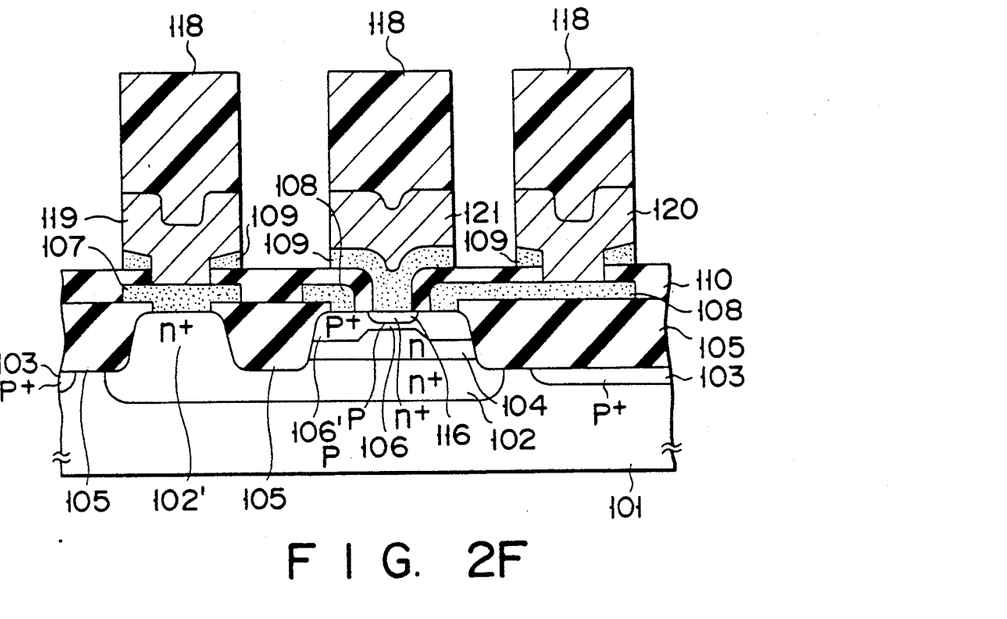

As shown in FIG. 2F, a photoresist film 118 is formed on the entire surface of the resultant structure and developed by a photolithographic method to have a predetermined shape, and the aluminum layer 117 is patterned to have a predetermined shape by a reactive ion etching using CCl₄ gas or the like and using the photoresist film 118 as a mask. Subsequently, the emitter extracting electrode polysilicon layer 109 is patterned to form a collector electrode 119, a base electrode 120, and an emitter electrode 121. The step as described above is the second lithographic step.

Figure 2G:
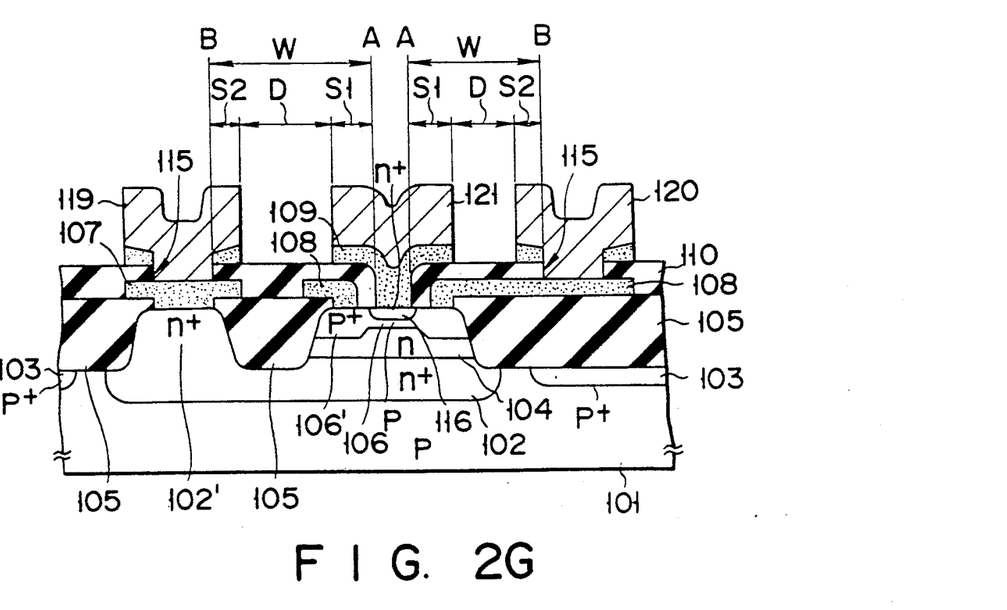

As shown in FIG. 2G, the photoresist layer 118 is removed, thereby forming a self-aligned bipolar transistor in a method of manufacturing a semiconductor device according to the present invention.

Intervals between an emitter opening edge and an opening edge of a collector electrode contact portion, and between an emitter opening edge and an opening edge of a base electrode contact portion of a self-aligned bipolar transistor manufactured by a method of manufacturing a semiconductor device according to the first embodiment will be described below with reference to FIG. 2G.

As shown in FIG. 2G, in the above first lithographic step, when an alignment margin between the collector extracting electrode polysilicon layer 107 and the contact hole 115, and an alignment margin between the base extracting electrode polysilicon layer 108 and the contact hole 115 are taken into consideration, these alignment margins are assured to be included in the width of the collector extracting electrode polysilicon layer 107 and the width of the base extracting electrode polysilicon layer 108, respectively. Therefore, further consideration will not be made on the alignment margins. In the second lithographic step, an alignment margin S2 between the collector electrode 119 and an opening edge B of a collector electrode contact portion, an alignment margin S2 between the base electrode 120 and an opening edge B of a base electrode contact portion, and an alignment margin S1 between an emitter opening edge A and the emitter electrode 112 are examined. When both the intervals between the emitter electrode 121 and the base electrode 119, and between the emitter electrode 121 and the collector electrode 120, are represented by D, the interval between the emitter opening edge A and the base electrode contact portion B, or an alignment margin between the emitter opening edge and the opening edge B of the collector electrode contact is calculated by the following equation:

$$W = S1 + S2 + D$$

The width W of the alignment margin is reduced by a length corresponding to one alignment cycle. That is, an alignment margin S3 estimated in the prior art is not required. In addition, the alignment margin S1 of the reduced alignment margin is smaller than a conventional alignment margin S1, since the conventional alignment margin S1 is set larger than a normal alignment margin by 0.5 μm or more so as not to decrease an effective concentration of an impurity which forms an emitter region and is included in the emitter extracting electrode polysilicon layer. In this embodiment, however, since the effective concentration is not decreased, the length of 0.5 μm is not required. As has been described above, electrodes and extracting electrodes (especially the emitter extracting electrode polysilicon layer 109 formed on an element) can be micropatterned by decreasing the number of lithographic steps.

In addition, according to a method of manufacturing a semiconductor device (self-aligned bipolar transistor) of the first embodiment, at least three lithographic steps required in a conventional manner can be reduced to two. Therefore, since an alignment margin corresponding to one lithographic step need not be performed, this embodiment is suitable for micropatterning of an element. In addition, in a conventional method, since the side-etched portion 313 is formed on an emitter extracting electrode polysilicon layer 309 (FIG. 1B), an effective concentration of an impurity for forming an emitter region is decreased. According to this embodiment, however, as shown in FIG. 2B, this problem is solved by leaving the emitter extracting electrode polysilicon layer 109 in a wide region up to the collector contact hole forming region 107' and in a wide region up to the base contact hole forming region. In the conventional method, the emitter extracting electrode polysilicon layer must be increased with the alignment margin or more. However, according to this embodiment, the emitter extracting electrode polysilicon layer 109 has an alignment margin only for the emitter opening edge. Therefore, this embodiment is suitable for micropatterning of an element.

As has been described above, according to the present invention, since the number of lithographic steps can be decreased, electrodes and wiring layers of an element can be formed in a small area at a density higher than the conventional method. Therefore, micropatterning of the element, an increase in yield due to a decrease in the number of lithographic steps, and a decrease in production cost can be achieved. In addition, a parasitic element can be decreased by decreasing element size. Particularly, depending on the shortening of the emitter extracting electrode polysilicon layer 109, for example, the base extracting electrode polysilicon layer 108 can be shortened to decrease base resistance. Thus, a parasitic element such as a base resistor can be decreased. Furthermore, since a polysilicon layer is present under a metal wiring layer made of, e.g., aluminum, a step difference caused by an underlying structure is decreased, thereby preventing wiring disconnections. As described above with reference to FIG. 2C, since contact patterns of the base and collector are formed before the impurity for forming the emitter region 116 is diffused, an insulating film is partially removed, thereby easily monitoring transistor characteristics. This is effective to control diffusion.

FIGS. 3A to 3G are sectional views showing semiconductor structures in manufacturing steps in a method of manufacturing a semiconductor device according to the second embodiment of the present invention.

The second embodiment examplifies applicability of the present invention to not only a method of manufacturing a self-aligned bipolar transistor but also to a method of manufacturing a general bipolar transistor.

Figure 3A:
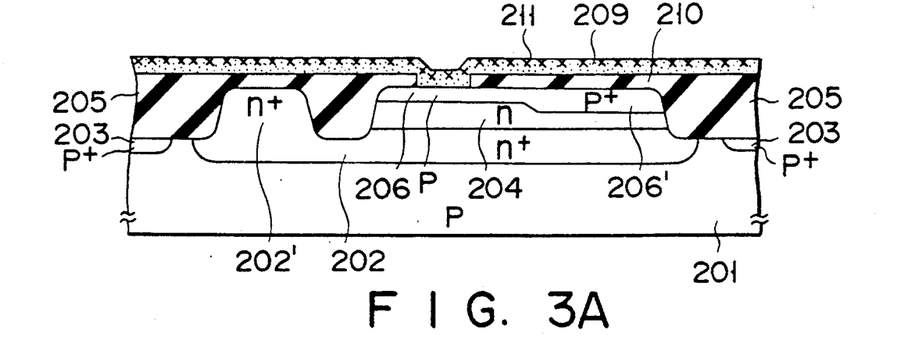
FIGS. 3A to 3G are sectional views showing semiconductor structures in manufacturing steps of a method of manufacturing a semiconductor device according to the second embodiment of the present invention.

FIG. 3A shows a section of a semiconductor structure corresponding to a step in which an emitter extracting electrode polysilicon layer 209 is formed by a method of manufacturing a general bipolar transistor.

As shown in FIG. 3A, a heavily doped n⁺-type buried layer 202 is formed on, e.g., a p-type silicon substrate 201. An n-type epitaxial layer 204, prospectively serving as a collector region, and a heavily doped n⁺-type diffusion region 202', prospectively serving as a collector extracting region, and having a concentration higher than that of the n-type epitaxial layer 204, are formed on the heavily doped n⁺-type buried layer 202. In addition, a field oxide film 205 is formed as an element isolating region. A heavily doped p⁺-type channel cut region 203 is formed under the field oxide film 205, serving as the element isolating region. An oxide film 210 is formed on the element region isolated by the field oxide film 205. A heavily doped p+-type outer base region 206' and a p-type intrinsic base region 206 are formed in the surface region of the n-type epitaxial layer 204, prospectively serving as a collector region. An emitter opening is formed toward the p-type intrinsic base region 206 through the oxide film 210. In addition, a polysilicon layer 209, prospectively serving as an emitter extracting electrode is formed on the entire surface including the emitter opening of the resultant structure. An n-type impurity, such as arsenic 211, for forming an n-type emitter region is ion-implanted in the emitter extracting electrode polysilicon layer 209. In place of ion implantation, an impurity may be contained in the polysilicon layer 209 by, e.g., a CVD method during formation of the polysilicon layer 209. However, in order to highly precisely control the impurity distribution of the emitter region, ion implantation is better than CVD.

Figure 3B:
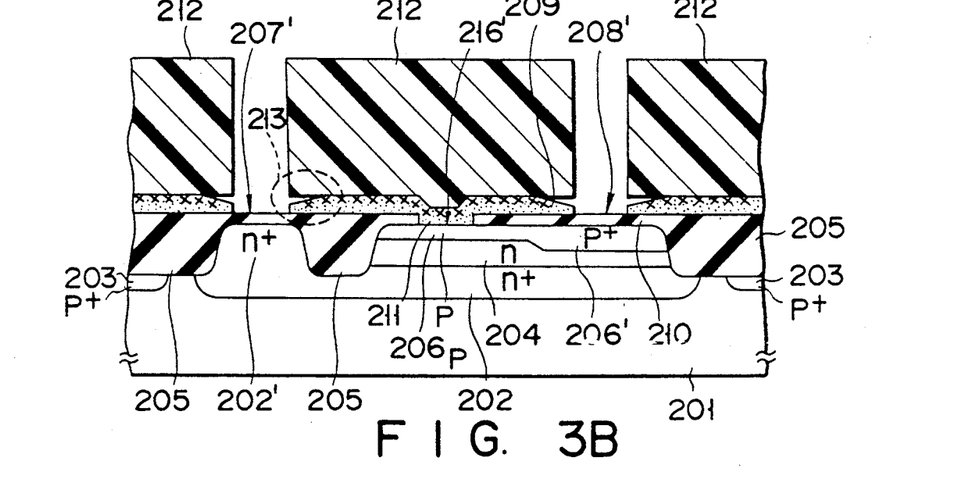

As shown in FIG. 3B, a photoresist layer 212 is formed on the entire surface of the resultant structure and developed to have a predetermined shape by a photolithographic method, and the emitter extracting electrode polysilicon layer 209 is patterned to have a predetermined shape using the photoresist film 212 as a mask. In this patterning process, an opening toward a region 207' for prospectively forming a contact hole reaching the heavily doped n+-type collector extracting electrode region 202', and an opening toward a region 208', for prospectively forming a contact hole reaching the heavily doped p+-type outer base region 206', are formed in the polysilicon layer 209. The above step is the first lithographic step of the second embodiment. In this case, as in the prior art, when the emitter extracting electrode polysilicon layer 209 is patterned by a normal reactive ion etching method using, e.g., CF$_4$+O$_2$ gas, the polysilicon layer 209 is side-etched to form a side-etched portion 213. According to the second embodiment, however, since the polysilicon layer 109 is left in wide regions between a prospective emitter forming region 216' and a prospective collector contact hole forming region 207' and between a prospective emitter forming region 216', and the prospective base contact hole forming region 208', an effective concentration of the impurity which forms an emitter region and is contained in the polysilicon layer 209 is not decreased.

Figure 3C:
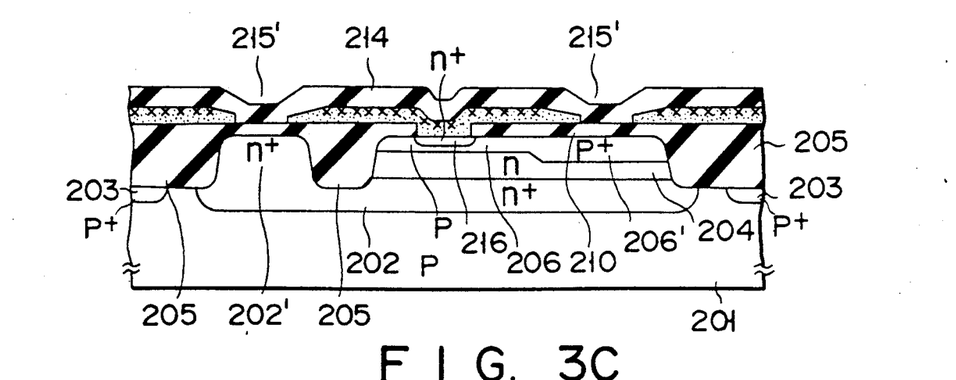

As shown in FIG. 3C, the photoresist layer 212 is removed, and a silicon oxide film 214 is formed on the entire surface of the resultant structure by, e.g., a CVD method. Thereafter, the arsenic ions 211, serving as an n-type impurity in an emitter extracting electrode polysilicon layer 209, are thermally diffused by annealing to form a heavily doped n+-type emitter region 216 in the base region.

Figure 3D:
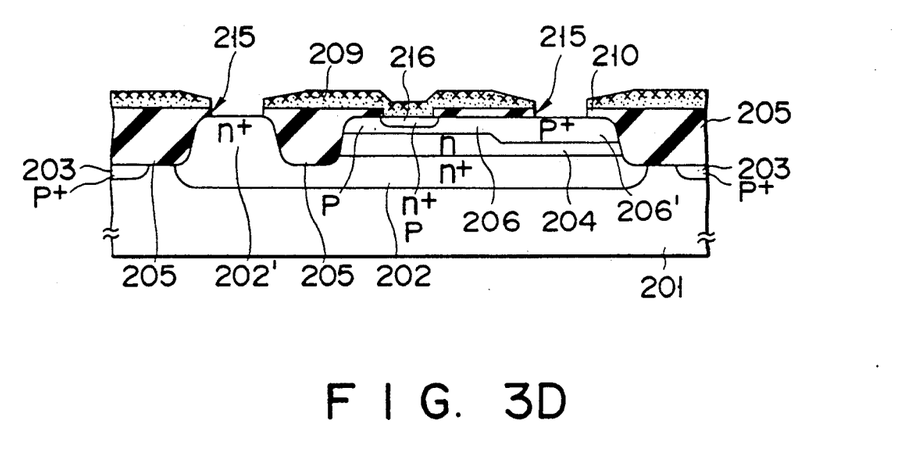

As shown in FIG. 3D, the oxide film 214 is removed by a reactive ion etching method using, e.g., CF$_4$ and H$_2$ gases and etching is continued to form contact holes 215, respectively reaching the heavily doped n+-type collector extracting region 202' and the heavily doped p+-type outer base region 206 in the oxide film 210, using the emitter extracting electrode polysilicon layer 209 as a mask patterned into a predetermined shape.

Figure 3E:
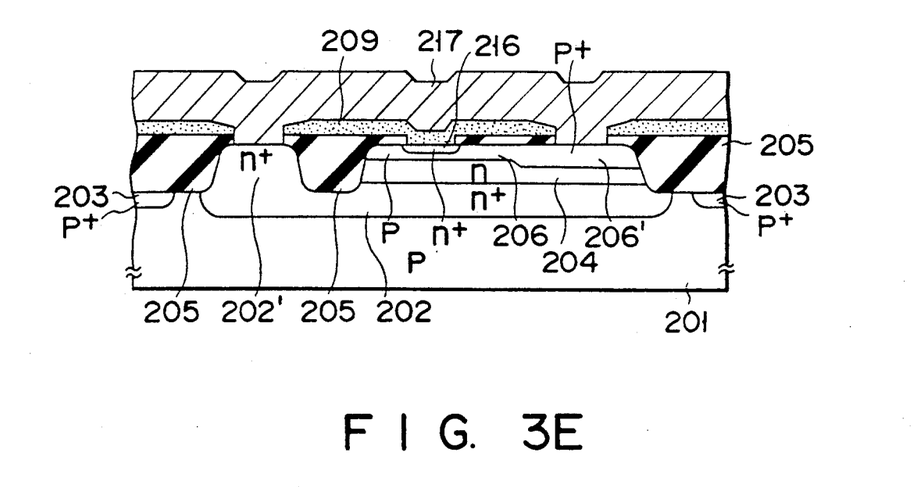

As shown in FIG. 3E, an aluminum layer 217 is formed on the entire surface of the resultant structure by, e.g., a sputtering method. In this case, any electrode material can be selected in place of aluminum.

Figure 3F:
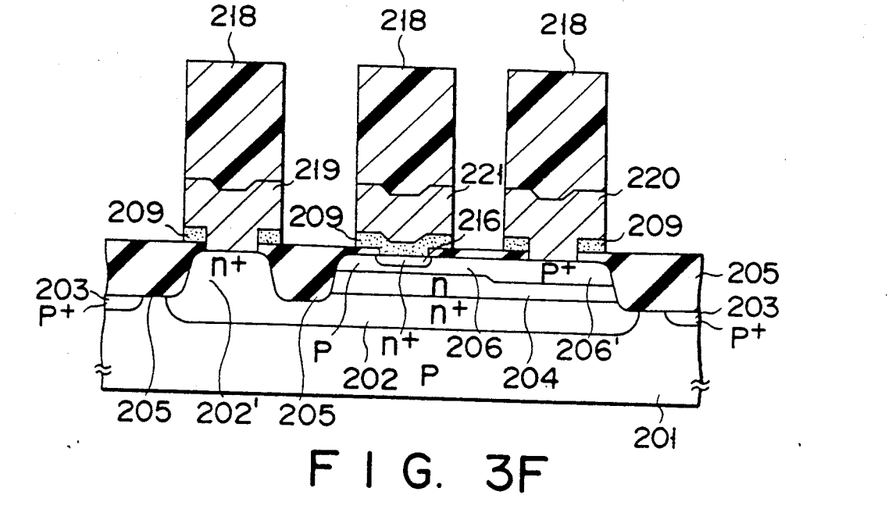

As shown in FIG. 3F, a photoresist film 218 is formed on the entire surface of the resultant structure and developed by a photolithographic method to have a predetermined shape, and the aluminum layer 217 is patterned to have a predetermined shape by a reactive ion etching using CCl$_4$ gas or the like and using the photoresist film 218 as a mask. Subsequently, the emitter extracting electrode polysilicon layer 209 is patterned to form a collector electrode 219, a base electrode 220, and an emitter electrode 221. The step as described above is the second lithographic step of the second embodiment.

Figure 3G:
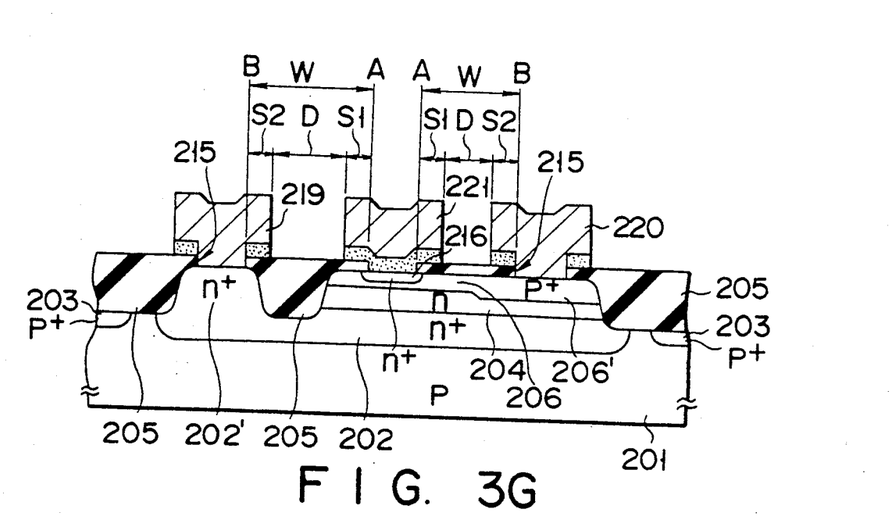

As shown in FIG. 3G, the photoresist layer 218 is removed, thereby forming a general bipolar transistor in the method of manufacturing a semiconductor device according to the second embodiment of the present invention.

Intervals between the emitter opening edge and the collector opening edge and between the emitter opening edge and the base opening edge will be described below with reference to FIG. 3G.

As shown in FIG. 3G, in the first lithographic step, when the alignment margin between the heavily doped n+-type collector extracting region 202 and the contact hole 215, and the alignment margin between the p-type outer base region 206' and the contact hole 215 are taken into consideration, these alignment margins are assured to be included in the width of the collector extracting region 202' and the width of the outer base extracting region 206', respectively. Therefore, a further consideration will not be made on these alignment margins. In the second lithographic step, the alignment margin S1 between the emitter electrode 221 and the emitter opening edge A, the alignment margin S2 between the collector electrode 219 and the collector opening edge, and the alignment margin S2 between the base electrode 220 and the base opening edge B are examined. In the second lithographic step, assume that an interval between the aluminum layer 217 and each electrode is represented by D, an interval W between the emitter opening edge A and the collector opening edge B and a width W between the emitter opening edge A and the base opening edge B are expressed by the following equation:

$$W = S1 + S2 + D$$

The width W of the alignment margin can be reduced by a length corresponding to the alignment margin S3, as in the first embodiment.

In addition, according to a method of manufacturing a semiconductor device (bipolar transistor), as in the first embodiment, since the three lithographic steps of conventional embodiments can be reduced to two lithographic steps, the second embodiment is suitable for micropatterning of an element. Furthermore, as in the first embodiment, production yield can be improved, and production cost can be reduced.

The emitter extracting electrode polysilicon layer 209 is left in a wide region up to the collector contact hole forming region 207' and a wide region up to the base contact hole forming region 208', even when a sideetched portion 213 is formed in the polysilicon layer 209. The concentration of the impurity for forming the emitter region is not actually decreased. Therefore, the formation of the side-etched portion 213 is not disadvantageous in micropatterning of an element. In addition, as in the first embodiment, since a polysilicon layer is present under the wiring layer, a step difference caused by an underlying structure is reduced. Therefore, wiring disconnections do not tend to occur. Since contact patterns of the base and collector are formed before the impurity for forming the emitter region 216 is diffused, an insulating film is partially removed, thereby easily monitoring transistor characteristics. This is effective to control diffusion.

As described above, according to the present invention, in steps of forming an electrode of a semiconductor and a metal wiring, the number of lithographic steps can be reduced. Therefore, with conventional lithographic precision, electrodes and wiring layers of elements can be formed at a high density, thereby improving the degree of integration. A method of manufacturing a semiconductor device having a good yield and low production cost can thus be provided.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a bipolar transistor including at least a collector region of a first conductivity type on a semiconductor substrate, a base region of a second conductivity type formed in the collector region of the first conductivity type, and an insulating film having at least one opening in the base region, comprising the steps of:

forming an insulating film on a base region to have an opening in a prospective base forming region of a semiconductor substrate;

forming a polycrystalline semiconductor layer entirely doped with an impurity of the first conductivity type;

selectively etching a prospective base electrode forming region and a prospective collector electrode forming region of said polycrystalline semiconductor layer;

diffusing an impurity of the first conductivity type in a base region through said opening of said insulating film in said base region to form an emitter region of the first conductivity type; and selectively removing said insulating film using said polycrystalline semiconductor layer as a mask to form base and collector electrode contact holes; forming a conductive layer on an entire surface of a resultant structure; selectively etching said conductive layer and said polycrystalline semiconductor layer.

2. A method of manufacturing a semiconductor device according to claim 1, in which said semiconductor substrate comprises a silicon substrate.

* * * * *